(12) United States Patent
Tabatake et al.

(10) Patent No.: US 7,564,511 B2
(45) Date of Patent: Jul. 21, 2009

(54) METHOD OF FABRICATING A CIRCUIT ARRAY SUBSTRATE

(75) Inventors: Hiroshi Tabatake, Saitama-ken (JP); Tetsuya Kawamura, Saitama-ken (JP); Shinichi Kawamura, Tokyo (JP); Katsuhiko Inada, Saitama-ken (JP); Atsushi Takeda, Saitama-ken (JP); Nobuo Imai, Saitama-ken (JP); Akihiro Takami, Saitama-ken (JP)

(73) Assignee: Toshiba Matsushita Display Technology Co., Ltd., Tokyo (JP)

(*) Notice: Subject to any disclaimer, the term of this patent is extended or adjusted under 35 U.S.C. 154(b) by 156 days.

(21) Appl. No.: 10/968,961

(22) Filed: Oct. 21, 2004

(65) Prior Publication Data

US 2005/0140570 A1 Jun. 30, 2005

(30) Foreign Application Priority Data

Oct. 28, 2003 (JP) .......................... P2003-367276

(51) Int. Cl.
*G02F 1/1333* (2006.01)

(52) U.S. Cl. ............................ 349/40; 349/43; 349/187

(58) Field of Classification Search .................. 349/43, 349/40, 187
See application file for complete search history.

(56) References Cited

U.S. PATENT DOCUMENTS

| | | | |
|---|---|---|---|
| 6,211,534 B1 | 4/2001 | Matsumoto | |
| 6,515,720 B1 | 2/2003 | Iizuka et al. | |
| 6,580,093 B2* | 6/2003 | Chung et al. | 257/72 |
| 6,888,585 B2* | 5/2005 | Kim | 349/43 |
| 6,927,808 B2* | 8/2005 | Ono et al. | 349/43 |
| 6,958,802 B2* | 10/2005 | Watamura | 349/192 |
| 2005/0088596 A1* | 4/2005 | Shimizu et al. | 349/139 |

FOREIGN PATENT DOCUMENTS

| | | |
|---|---|---|
| EP | 0 504 792 B1 | 9/1992 |
| EP | 0 504 792 | 6/1995 |
| EP | 0 772 073 | 5/1997 |
| EP | 0 772 073 A1 | 5/1997 |
| JP | 2003-110019 | 4/2003 |

\* cited by examiner

*Primary Examiner*—David Nelms
*Assistant Examiner*—Nathanael R Briggs
(74) *Attorney, Agent, or Firm*—Oblon, Spivak, McClelland, Maier & Neustadt, P.C.

(57) ABSTRACT

A circuit array substrate includes an optically transparent substrate, pixels having switching elements formed on the transparent substrate, gate electrode lines connected to the switching elements, the gate electrode lines being provided on a first insulation film with separating portions in the pixels, signal lines connected to the switching elements, the signal lines being provided on a second insulation film which is different from the first insulation film, and electrically conductive portions provided on the second film to electrically connect the electrode lines with the separating portions to each other. The separating portions reduce electrostatic capacitances defined between the gate electrode lines and the switching elements when the conductive portions are not connected between the separating portions.

1 Claim, 6 Drawing Sheets

METHOD OF FABRICATING A CIRCUIT ARRAY SUBSTRATE

CROSS-REFERENCE TO RELATED APPLICATION

This application is based upon and claims the benefit of priority from the prior Japanese Patent Application No. 2003-367276, filed on Oct. 28, 2003, the entire contents of which is incorporated in this application by reference.

FIELD OF THE INVENTION

This invention generally relates to a circuit array substrate with switching elements and a flat panel display device provided with such a circuit array substrate.

BACKGROUND OF THE INVENTION

A prior art flat panel display device, such as an active matrix type liquid crystal display device (AMLCD) includes amorphous silicon thin-film transistors as switching elements of pixels because their active semiconductor layers, such as amorphous silicon films, can be uniformly formed on a large-area optically-transparent substrate at relatively low temperatures. Recently, thin-film transistors for driver circuits have been also formed at circumferences on the same substrate as those for such switching elements. It is disclosed in Japanese Unexamined Patent Publication 2000-187248, and, particularly, at its pages 4 through 6 and FIGS. 1 through 3 that the active semiconductor layers of such thin-film transistors are made from polycrystalline silicon because the mobility of the polycrystalline silicon by electric field effect is greater than that of the amorphous silicon.

Since the substrate of a prior art AMLCD, however, is made of a glass plate which is optically transparent and electrical insulation, static electricity is charged on the substrate. The static electricity may destroy the switching elements or the driver circuits to significantly lower a yield of the AMLCD. The static electricity has been higher as a size of the substrate has been bigger. As a result, electrostatic destruction of the switching elements and driver circuits becomes a more critical problem.

When the substrate charged with static electricity, for instance, is lifted up by pins or is placed on projected pads from a grounded stage, grounded states at portions of the substrate on the pins or pads differ from those of the other portions of the substrate. They cause redistribution of charges of the static electricity so that voltages at the portions of the substrate on the pins or pads are induced several-tens of times or more than those of the other portions of the substrate.

In the case, particularly, that a gate insulation film is formed at small polycrystalline silicon patterns isolated from major ones on the substrate, that long gate-electrode leads are formed on the gate insulation film, and that electric capacitors are formed between the polycrystalline silicon patterns and the gate-electrode leads, such redistribution of charges of the static electricity has a more adverse affect than when the substrate is lifted up by pins or is placed on projected pads from the grounded stage. Electrostatic destruction may occur between the polycrystalline silicon patterns and the gate electrode lines. In other words, it is highly possible for the static electricity to destroy the thin-film transistors.

SUMMARY OF THE INVENTION

Accordingly, the present invention provides a circuit array substrate to prevent the occurrence of such electrostatic destruction in thin-film transistors and a flat panel display with the same.

The first aspect of the present invention is directed to a circuit array substrate provided with an optically transparent substrate, pixels having switching elements formed on the transparent substrate, electrode lines connected to the switching elements, the electrode lines having separating portions, and electrically conductive portions provided in a different film from the electrode lines to electrically connect the electrode lines to each other, which are separated by the separating portions.

The second aspect of the present invention is directed to a flat panel display device provided with an optically transparent substrate, pixels having switching elements formed on the transparent substrate, electrode lines connected to the switching elements, the electrode lines having separating portions, electrically conductive portions provided in a different film from the electrode lines to electrically connect the electrode lines to each other, which are separated by the separating portions, and an optical modulator.

Since the electrode lines are separated by the separating portions, lengths of the electrode lines are shortened. Thus, when transparent substrate is lifted up while it is charged with static electricity, the increase in voltages between the electrode lines and switching elements are effectively suppressed so that electrostatic destruction of the switching elements can be prevented.

DETAILED DESCRIPTION OF THE PREFERRED EMBODIMENT

A flat panel display device such as a liquid crystal display device of the first embodiment in accordance with the present invention will be described below with reference to FIGS. 1-3.

Figure 1:
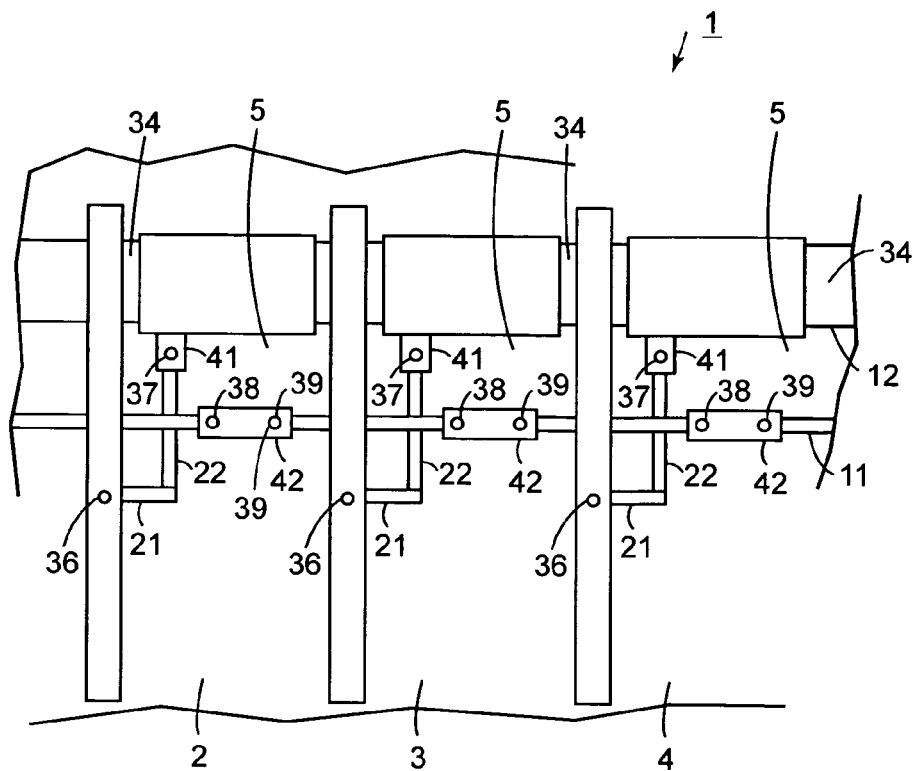
FIG. 1 is a schematic plan view of a part of a flat panel display device in accordance with the first embodiment of the present invention.
Figure 2:
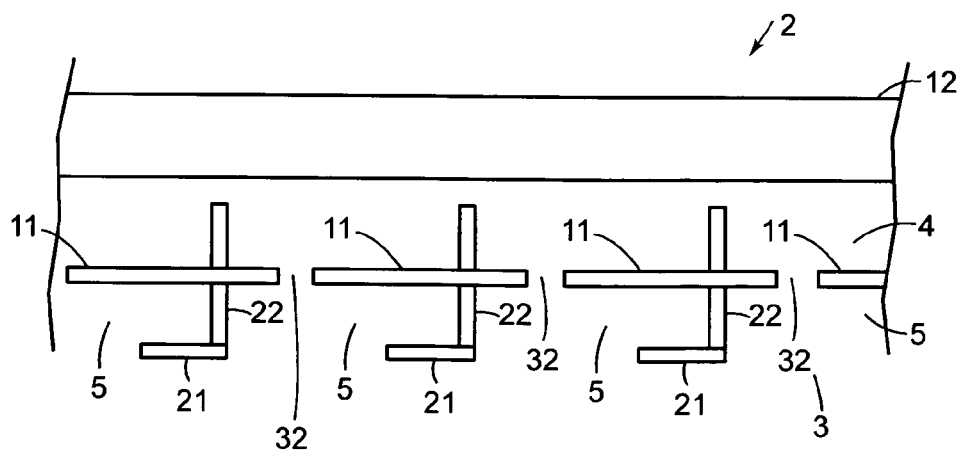
FIG. 2 is another schematic partial plan view of the flat panel display device shown in FIG. 1.
Figure 3:
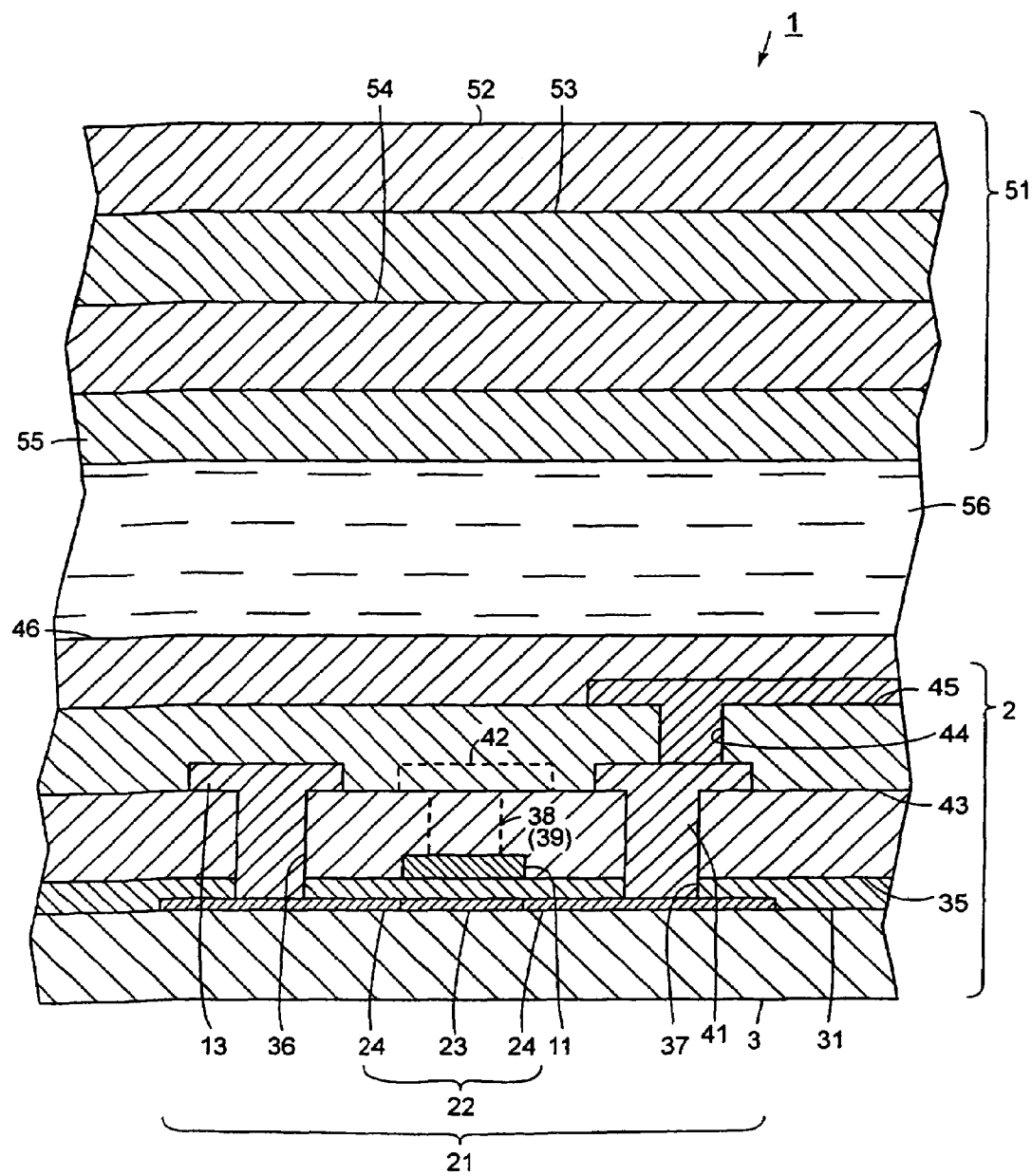
FIG. 3 is a schematic cross-sectional view of the flat panel display device shown in FIG. 2.

Liquid crystal display device 1 shown in FIGS. 1-3 includes top gate type or reverse-stagger type polycrystalline silicon thin-film transistors. Further, liquid crystal display device 1 is an AMLCD provided with a substantially rectangular plate-like circuit array substrate 2. Circuit array substrate 2 has glass substrate 3 which is substantially rectangular and optically transparent but electrically insulated. One main surface of glass substrate 3 includes substantially rectangular display region 4 formed on its major portion. Display region 4 is provided with a plurality of pixels 5 disposed in a dotted matrix.

Further, display region 4 of glass substrate 3 contains gate electrode lines 11, i.e., gate electrodes of thin-film transistors and scanning lines connected to the gate electrodes. Gate electrode lines 11 are disposed in parallel with the horizontal direction of glass substrate 3 and are equally spaced in the vertical direction of glass substrate 3. Common capacitor lines 12 are provided between gate electrode lines 11, are disposed in the horizontal direction of glass substrate 3 as electrode and auxiliary capacitor lines, and are equally spaced in the vertical direction of glass substrate 3.

Further, signal electrode lines 13 are formed on glass substrate 3 and are disposed in the vertical direction of glass substrate 3 as signal and electrode lines. Signal electrode lines 13 are made from the same materials as gate electrode lines 11 and common capacitor lines 12. Signal electrode lines 13, gate electrode lines 11 and common capacitor lines 12 each are provided for pixels 5, which are arranged in grid-like structure.

Meanwhile, an undercoat film not shown but stacked with silicon nitride, silicon oxide, etc. is deposited on the main surface of glass substrate 3. Thin-film transistors 21 are formed on the undercoat film as pixel components provided for each pixel 5. Thin-film transistors 21 include polycrystalline silicon films 22 as polycrystalline semiconductor layers.

Polycrystalline semiconductor films 22 such as polycrystalline silicon (p-Si) films are made by the irradiation of excimer laser beams to anneal amorphous silicon (a-Si) films, i.e., by melting and crystallizing the a-Si films. Polycrystalline semiconductor films 22 are semiconductor patterns for thin-film transistors with which active semiconductor layers 23 are provided at the central portions as channel regions. Ohmic contact regions 24 are formed on both sides of active semiconductor layers 23 which function as source and drain electrode regions.

Gate insulation films 31 made from silicon oxide insulation films are formed on the undercoat film to cover active semiconductor layers 23 and ohmic contact regions 24 of thin-film transistors 21. A plasma chemical vapor deposition method is applied to deposit silicon oxide for gate insulation films 31 on the undercoat film.

Gate electrode lines 11 are formed on portions corresponding to active semiconductor layer 23 of thin-film transistors 21 and are equally spaced in the lengthwise direction of active semiconductor layer 23.

Here, gate electrode lines 11 are separated from each other by separating portions 32 as shown in FIG. 2. Separating portions 32 are electrically discontinued between gate electrode lines 11 and are provided in the horizontal direction of gate electrode lines 11 for respective pixels 5. Separating portions 32 each are disposed between thin-film transistors 21 of pixels 5 to shorten the length of each gate electrode line 11 arranged for pixel 5.

Accumulation capacitors 34 are formed on gate insulation films 31 separated from gate electrode lines 11 and are provided with common capacitors 12. Common capacitors 12 are electrically isolated from, and are disposed in parallel with, gate electrode lines 11. Here, common capacitors 12 are made from the same materials, and in the same process, as gate electrode lines 11.

Common capacitors 12 and gate electrode lines 11 are covered with interlayer insulation film 35. A plasma chemical vapor deposition is applied to deposit and stack silicon nitride and silicon oxide to form interlayer insulation film 35. Further, contact holes 36 and 37 are made through gate insulation films 31 and interlayer insulation film 35 for electric conduction.

Contact holes 36 and 37 are provided for, and electrically connected to, ohmic contact regions 24 on both sides of gate electrode lines 11 of thin-film transistors 21.

Contact holes 36 are filled with electrically conductive films to connect ohmic contact regions 24 to signal electrode lines 13 which function as source electrodes of thin-film transistors 21.

Further, contact holes 37 are filled with electrically conductive films to connect ohmic contact regions 24 to drain electrodes 41 of thin-film transistors 21. Drain electrodes 41 face common capacitor lines 12 of accumulation capacitors 34 to define auxiliary capacitors with common capacitor lines 12 through interlayer insulation film 35. Drain electrodes 41 are placed in the same layer, made from the same materials and formed by the same process as signal electrode lines 13. Thin-film transistors 21 are composed of signal electrode lines 13, drain electrodes 41, polycrystalline semiconductor films 22, gate electrode lines 11, gate insulation film 31 and interlayer insulation film 35.

On the other hand, a pair of contact holes 38 and 39 are provided on both sides of separating portion 32 of gate electrode line 11 and are connected to edge portions of gate electrode lines 11 separated by separating portion 32. Island-like electrically conductive films 42 are filled in contact holes 38 and 39 and are formed on interlayer insulation film 35 to connect one edge portion to another of gate electrode lines 11 separated by separating portions 32 through contact holes 38 and 39. Thus, electrically conductive films 42 are deposited in contact holes 38 and 39 and on interlayer insulation film 35. Conductive film 42 is similar to a character of "T" in cross-section as shown in FIG. 3 by dotted lines.

In other words, parts of gate electrode lines 11 extend to connect electrically conductive film 42. Conductive films 42 are placed in the same layer, made from the same materials, and formed by the same process, as signal electrode lines 13.

Signal electrode lines 13, drain electrodes 41 and interlayer insulation films 35 are covered with protection film 43. Contact holes 44 are made through protection film 43 are filled with electrically conductive films as electrically conductive portions. Contact holes 44 are made to reach to drain electrodes 41 of thin-film transistors 21.

Protection film 43 and contact hoses 44 are covered with transparent pixel electrodes 45 made from indium-tin-oxide (ITO) films. Transparent pixel electrodes 45 are electrically connected to drain electrodes 41 through contact holes 44.

Further, transparent pixel electrodes 45 are disposed at places facing common capacitor lines 12 through protection film 43 and interlayer insulation film 35. Transparent pixel electrodes 45 are controlled by thin-film transistors 21 provided in pixels 5. Alignment film 46 is deposited on protection film 43.

Circuit array substrate 2 faces rectangular plate-like counter substrate 51 provided with transparent glass substrate 52. Red, green and blue dotted color filters 53 are disposed on a main surface of counter substrate 51 facing circuit array substrate 2. Those color filters 53 are provided opposite to respective pixels 5.

Rectangular plate-like counter electrode 54 is formed on a surface of color filters 53. When the surface of counter substrate 51 is opposite to that of circuit array substrate 2, rectangular counter electrode 54 entirely faces display region 4 on glass substrate 3 of array substrate 2. Alignment film 55 is formed on the surface of counter substrate 51.

Circuit array and counter substrates 2 and 51 are provided opposite to each other while alignment film 46 of circuit array substrate 2 faces alignment film 55 of counter substrate 51. Thus, transparent pixel electrodes 45 of circuit array substrate 2 are opposite to counter electrode 54 of counter substrate 51. Liquid crystal composition 56 is held between alignment films 46 of circuit array substrate 2 and alignment film 55 of counter substrate 51 as an optical modulator. Circumferences of liquid crystal composition 56 are tightly sealed.

A manufacturing method of circuit array substrate 2 will be described below with reference to FIGS. 1-3.

First, after the formation of the undercoat film on glass substrate 3, a plasma chemical vapor deposition is carried out to form an amorphous silicon film, not shown, on the undercoat film.

Excimer laser beams are then irradiated to anneal the amorphous silicon film so that the same is melted and crystallized into a polycrystalline film.

Further, photolithography and etching processes are carried out to make the polycrystalline film island-like polycrystalline silicon patterns for polycrystalline silicon semiconductor films 22 of thin-film transistors 21. Next, a plasma chemical vapor deposition is applied to form gate insulation film 31 on island-like polycrystalline silicon patterns and the undercoat film.

Subsequently, a metal film, not shown, is deposited on gate insulation film 31. Photolithography and etching processes are then carried out for the metal film to form gate electrode lines 11 and common capacitors 12. Separating portions 32 are also provided on gate electrode lines 11.

Next, through a photomask of gate electrode lines 11, impurities are doped into portions where ohmic contact regions 24 are formed in polycrystalline semiconductor film 22 of thin-film transistors 21. Such doping of impurities can be an ion implantation, for instance. Thermal treatment is then carried out to activate the doped impurities so that the same can become as low in electric resistance as ohmic contact regions 24 in polycrystalline semiconductor film 22 of thin-film transistors 21.

A plasma chemical deposition is applied to form interlayer insulation film 35 on gate electrode lines 11 and common capacitor lines 12.

Subsequently, photolithography and etching processes are performed to make contact holes 36 and 37 connected to ohmic regions 24 in polycrystalline semiconductor film 22 of thin-film transistors 21 and contact holes 38 and 39 connected to the edge portions of gate electrode lines 11 separated by separating portions 32.

Subsequently, a metal film, not shown, is deposited on contact holes 36 and 37 and interlayer insulation film 35. Photolithography and etching processes are then carried out for the metal film to form signal electrode lines 13, drain electrodes 41 and electrically conductive films 42.

Thus, electrically conductive films 42 are extended through contact holes 36 and 37 to connect the edge portions of separated gate electrode lines 11 to each other.

Next, protection film 43 is formed on signal electrode lines 13, drain electrodes 41, electrically conductive films 42 and interlayer insulation film 35. Photolithography and etching processes are carried out for protection film 43 to form contact holes 44 connected to drain electrodes 41.

Further, a transparent pixel electrode layer, not shown, is formed on contact holes 44 and protection film 43. The transparent pixel electrode layer is subjected to photolithography and etching processes to form transparent pixel electrodes 45. Alignment film 46 is coated on pixel electrodes 45 and protection film 43 to complete circuit array substrate 2.

Alignment film 46 of circuit array substrate 2 is then provided opposite to alignment film 55 of counter substrate 51. Circuit array substrate 2 is assembled with counter substrate 51. Subsequently, liquid crystal composition 56 is filled in a gap defined between circuit array substrate 2 and counter substrate 51, and circumferences of liquid crystal composition 56 are then tightly sealed.

System circuits, polarizers, a rear light source, etc., not shown, are further assembled with circuit array substrate 2 and counter substrate 51 to produce liquid crystal display device 1.

Figure 8:
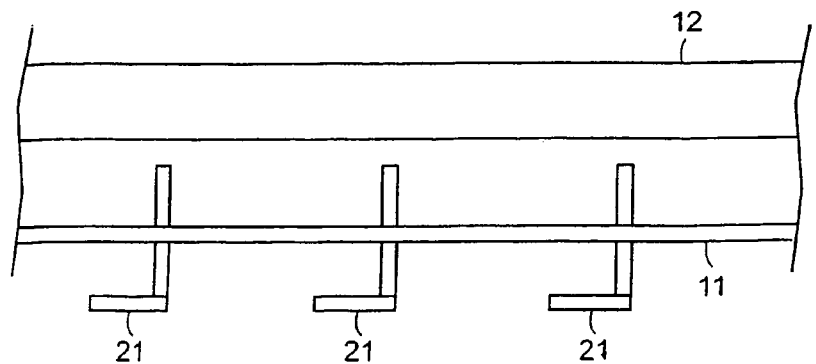
FIG. 8 is a schematic plan view of a prior art flat panel display device.

As described above, according to the first embodiment, liquid crystal display device 1 includes gate electrode lines 11 separated on glass substrate 3 by separating portions 32 and when gate electrode lines 11 are continuously linear, gate electrode lines 11 define auxiliary capacitors with polycrystalline semiconductor films 22 of thin-film transistors 21 unlike a prior art liquid crystal display device 1 shown in FIG. 8.

In the prior art liquid crystal display device 1, when glass substrate 3 is lifted up by movable pins, not shown, and grounded states of glass substrate 3 are changed, electrostatic charges are redistributed. As a result, voltages induced at gaps between gate electrode lines 11 and polycrystalline semiconductor films 22 through gate insulation film 31 may increase enough to cause electrostatic destruction of gate insulation film 31.

Figure 9:
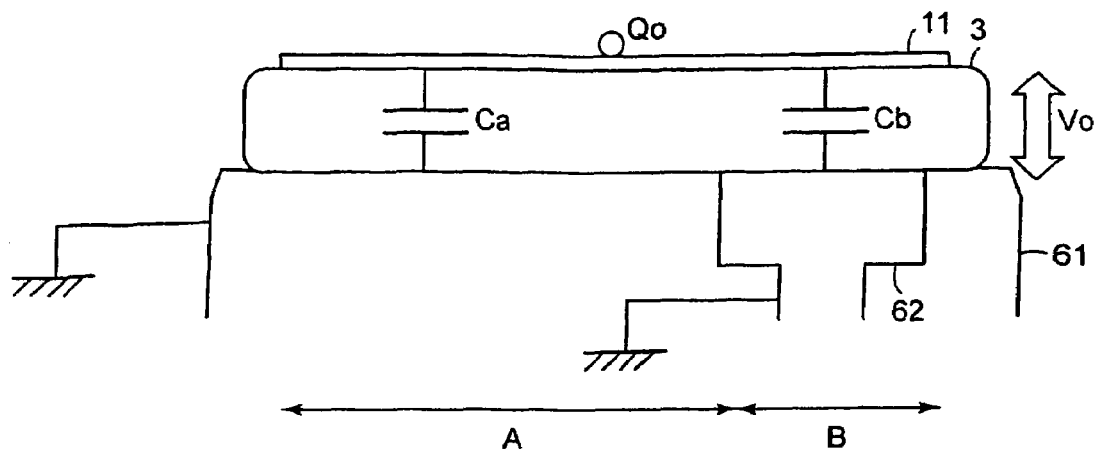
FIG. 9 is an equivalent circuit diagram of the flat panel display device shown in FIG. 8.

Here, in the case that glass substrate 3 on which polycrystalline semiconductor films 22 and gate electrode lines 11 are formed is grounded on stage 61, an equivalent circuit of display region 4 on glass substrate 3 will be explained below with reference to FIG. 9.

It is assumed in the equivalent circuit that electrostatic charge $Q_o$ is accumulated at gate electrode line 11, voltage $V_0$ occurs at gate electrode line 11, length A is a length of the first portion of gate electrode line 11 not overlapped with movable pin 62 and length B is a length of the second portion of gate electrode line 11 overlapped with movable pin 62. Further, capacitor Ca is defined between the first portion of gate electrode line 11 and stage 61 while, capacitor Cb is defined between the second portion of gate electrode line 11 and stage 61.

Since display region 4 of glass substrate 3 has repeated layouts of the same pattern as for respective pixels, capacitor Cb is expressed by the following equation:

$$Cb = B/(A \times Ca)$$

and the relationship between electrostatic charge Qo and voltage Vo is expressed by the following equation:

$$Qo = (Ca+Cb) \times Vo.$$

Figure 10:
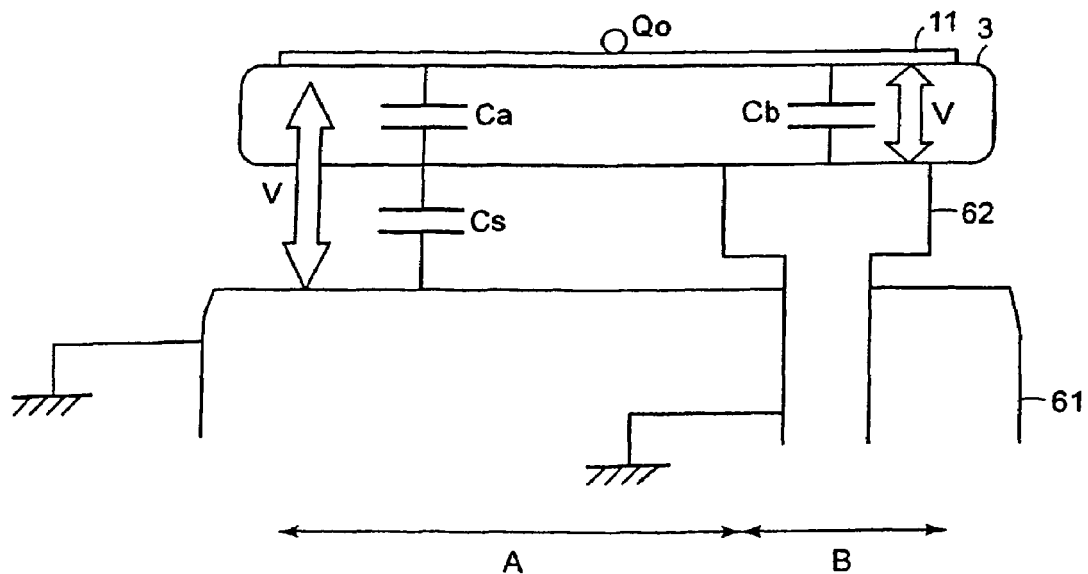
FIG. 10 is an equivalent circuit of the flat panel display device shown in FIG. 8 in a state different from that in FIG. 9.

Next, another equivalent circuit of display region 4 on glass substrate 3 will be described in the case that glass substrate 3 is supported and lifted up by movable pin 62. It is assumed in the equivalent circuit as shown in FIG. 10 that gate electrode line 11 is of potential V and capacitor Cs is defined between the first portion of gate electrode lines 11 and stage 61. Even when glass substrate 3 is lifted up by movable pin 62, the following relationship is established in accordance with the principle of conservation of electric charge:

$$Qo = \{Ca \times Cs/(Ca+Cs) + Cb\} \times V$$

From those three equations, the following relationship is derived:

$$V/Vo = (A+B)/\{A \times Cs(Ca+Cs)+B\}$$

The voltage ratio V/Vo defined immediately above will be described below in the case that a pattern of polycrystalline silicon semiconductor film 22 is formed on glass substrate 3 with a dielectric constant of "4" and a thickness of 100 mm, for instance, gate insulation film 31 is formed on polycrystalline silicon semiconductor film 22, gate electrode lines 11 is formed on gate insulation film 31 and glass substrate 3 is lifted up by electrically conductive movable pin 62 by 50 mm.

Figure 11:
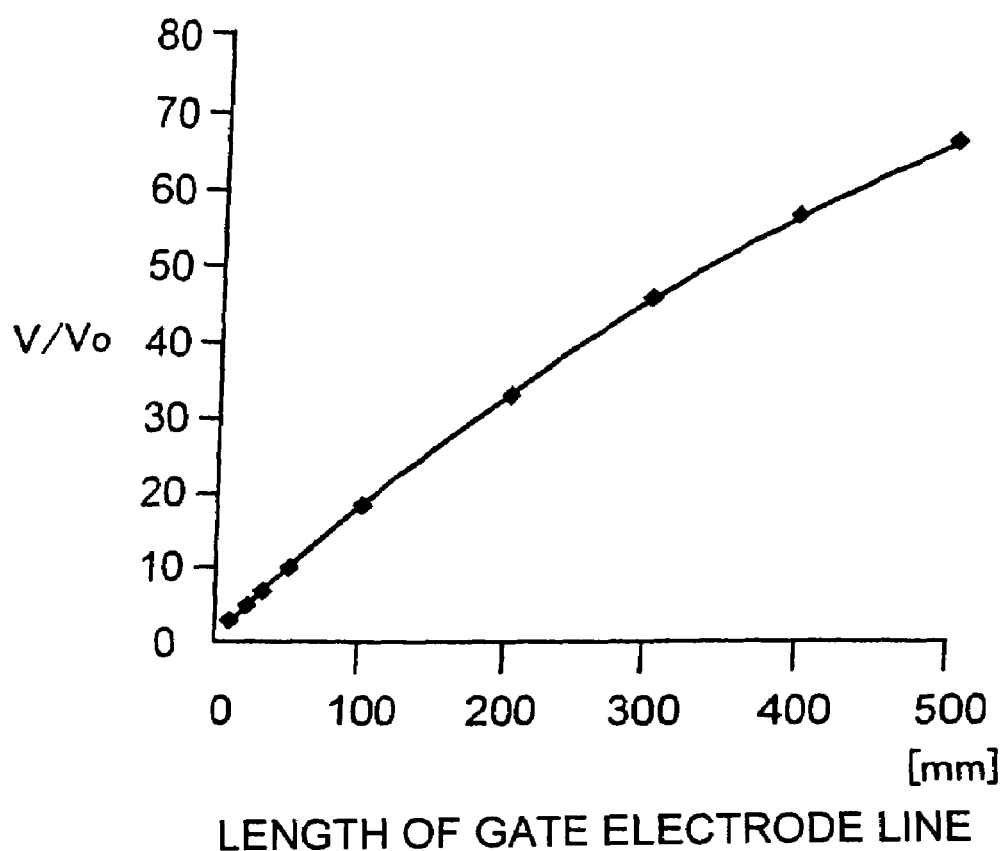
FIG. 11 is a characteristic curve relevant to the present invention.

At that time, while length B of gate electrode line 11 on movable pin 62 is fixed at 5 mm, the entire length of gate electrode line 11 is subjected to change. As a consequence, as shown in FIG. 11, when glass substrate 3 is lifted up by movable pin 62, it is effective to shorten the length of gate electrode line 11 in order to control voltages imposed between gate electrode line 11 and movable pin 62.

Thus, as described above, gate electrode line 11 is separated at each pixel 5 by separating portions 32 and electrically conductive films 42, which are made from the same materials as signal electrode lines 13 formed on interlayer insulation film 35, connect one edge portion of separated gate electrode line 11 to another to shorten the length of gate electrode line 11 for each pixel 5.

As a result, the increase in voltage imposed on gate insulation film 31 between gate electrode line 11 and polycrystalline silicon semiconductor film 22 and electrostatic destruction of gate insulation film 31 is effectively suppressed so that productivity of circuit array substrate 2 and liquid crystal display device 1 can be significantly improved.

Next, the second embodiment of the present invention will be described below with reference to FIGS. 4 and 5.

Figure 4:
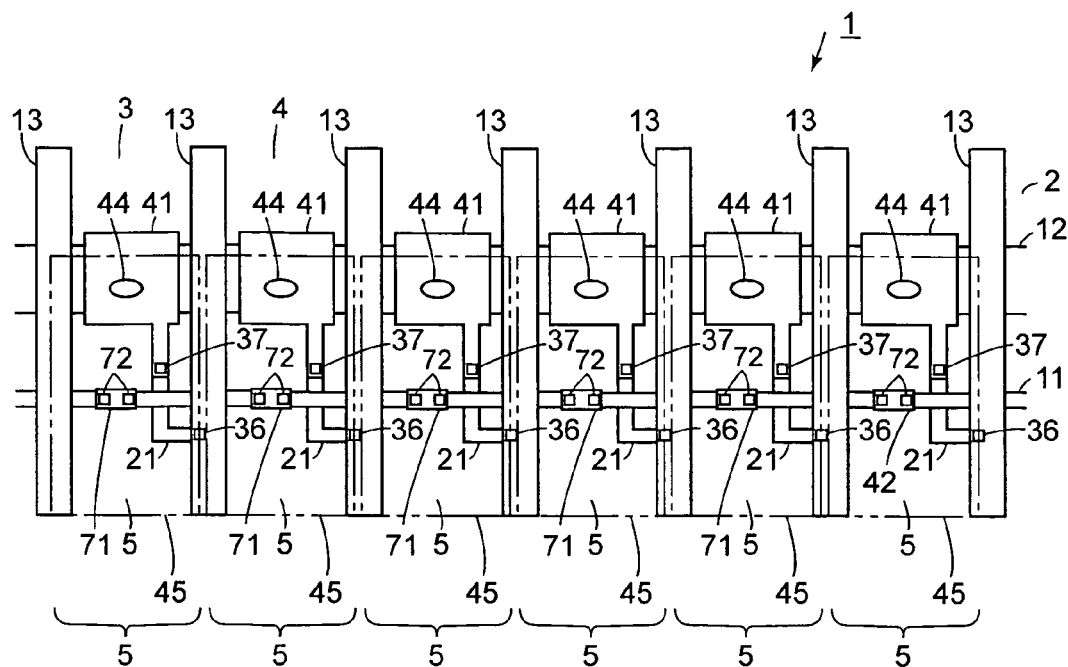
FIG. 4 is a schematic plan view of a part of a flat panel display device in accordance with the second embodiment of the present invention.
Figure 5:
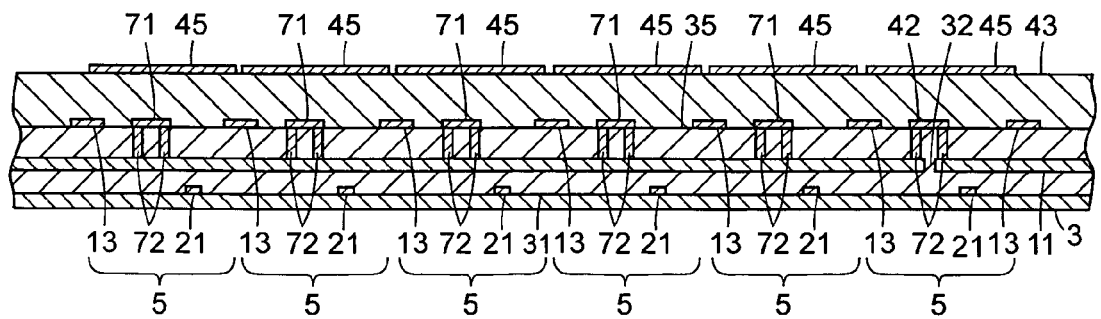
FIG. 5 is a schematic cross-sectional view of the flat panel display device shown in FIG. 4.

Liquid crystal display device 1 shown in FIGS. 4 and 5 is basically the same as liquid crystal display device 1 shown in FIGS. 1-3 but separating portions 32 are provided not for every pixel 5 but for a plurality of pixels 5. Separating portions 32 are disposed at respective pixels 5 of a predetermined color, for instance.

Here, dummy patterns 71 are prepared for pixels 5 where no separating portions 32 are formed. Dummy patterns 71 are the same in structure as conductive films 42. Both conductive films 42 and dummy patterns are formed on interlayer insulation film 35 which is different from gate insulation film 31 on which gate electrode lines 11 are formed. Both end portions of each conductive film 42 and dummy pattern 71 are electrically connected to gate electrode line 11 through contact holes 72.

Thus, even though separating portion 32 are provided only for every predetermined number of pixels 5 in display region 4 of glass substrate 3, when static-electricity charged glass substrate 3 moves, the increase of voltages at gate insulation film 31 between gate electrode lines 11 and polycrystalline silicon semiconductor film 22 on glass substrate 3 can be suppressed effectively in the same way as liquid crystal display device 1 of the first embodiment shown in FIGS. 1-3.

Further, the number of separating portions 32 decreases in comparison with that of the first embodiment and, as such, malfunctions hardly occur at contact holes 72 and conductive films 42 so that the decrease in yield rate can be prevented.

As described above, dummy patterns 71 are provided for pixels 5 where no separating portions 32 are formed and both end portions of each dummy pattern 71 are electrically connected to gate electrode lines 11. As a result capacitors defined between transparent pixel electrodes 45 of pixels 5, where dummy patterns 71 are formed, and gate electrode lines 11 have the same capacitance as those defined between transparent pixel electrodes 45 of pixels 5, where separating portions 32 are formed and electrically connected by conductive films 42, and gate electrode lines 11. Thus, no substantially uneven display is caused by pixels 5 with dummy patterns 71 and separating portions 32 and uneven display of display region 4 on glass substrate 3 is prevented.

Figure 6:
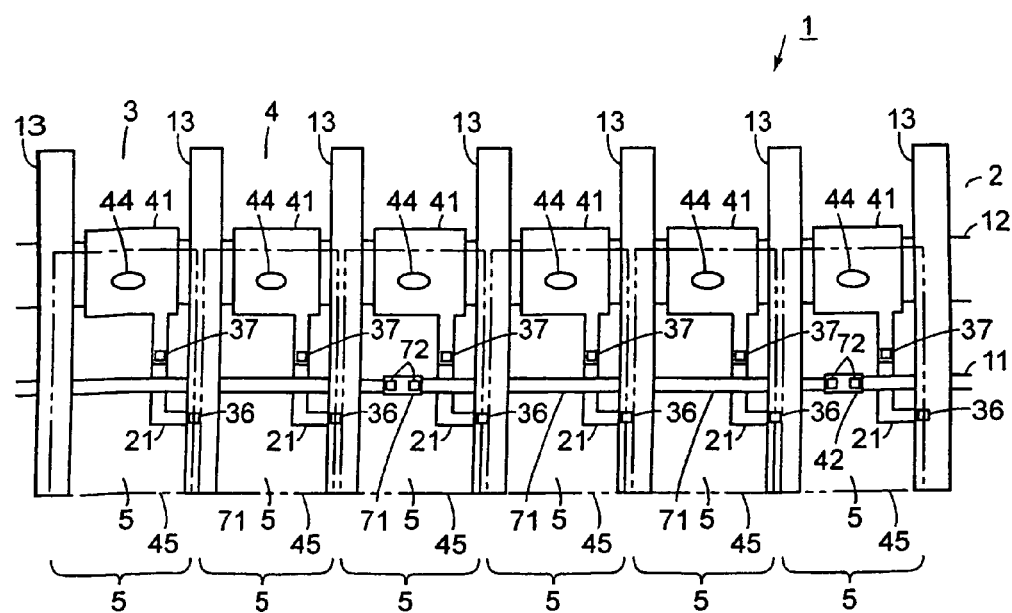
FIG. 6 is a schematic partial plan view of a flat panel display device of the third embodiment in accordance with the present invention.
Figure 7:
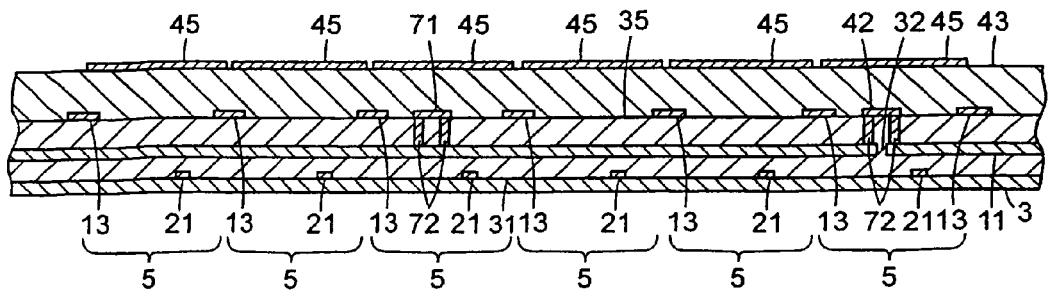
FIG. 7 is a schematic cross-sectional view of the flat panel display shown in FIG. 6.

Although dummy patterns 71 are formed on pixels 5 where no separating portions 32 are provided in liquid crystal display device 1 of the second embodiment, dummy patterns 71 in the third embodiment can be provided for pixels 5, the color of which is the same as that of all pixels 5 where separating portions 32 are formed as shown in FIGS. 6 and 7. In this case, capacitors defined between transparent pixel electrodes 45 in pixels 5, where dummy patterns 71 are formed, and gate electrode lines 11 are equal to those defined between transparent pixel electrodes 45 in pixels 5, where separating portions 32 are formed, and gate electrode lines 11. Thus, liquid crystal display device 1 of the third embodiment has substantially the same functions as that of the second embodiment.

In the embodiments described above, separating portions 32 are provided at gate electrode lines 11 and both end portions of gate electrode line 11 separated by separating portion 32 are electrically connected to each other by conductive films 42. Separating portions 32, however, can be provided at common capacitor lines 12 and both end portions of common capacitor line 12 are connected to each other to obtain substantially the same functions as the previous embodiments.

The present invention can be also applied to other electrode lines than gate electrode lines 11, such as signal or scanning lines connected to electrodes of thin film transistors in a stagger type liquid crystal display device. The invention can be applied a liquid crystal display device which makes use of diodes or other switching elements than thin-film transistors.

Further, the present invention can be applied to a liquid crystal display device composed of amorphous silicon thin-film transistors.

Although, by way of example, a liquid crystal composition 56 is held between circuit array substrate 2 and counter substrate 51 as an optical modulator of liquid crystal display device 1, the present invention can be applied to flat panel display devices provided with other optical modulators than liquid crystal compositions.

What is claimed is:

1. A method of fabricating a circuit array substrate, comprising:
   forming semiconductor islands on an optically transparent substrate;
   forming a first insulation film to cover said semiconductor islands;
   forming gate electrode lines on said first insulation film with separating portions;

separating said substrate including said gate electrode lines from a stage including a grounded movable pin wherein said separating portions reduce electrostatic capacitances generated between said gate electrode lines and said semiconductor islands, when separating said substrate from the stage, to prevent said first insulation film from being caused electrostatic destruction;

forming a second insulation film to cover said gate electrode lines;

forming signal lines on said second insulation film different from said first insulation film; and forming electrically conductive portions on said second insulation film to electrically connect said gate electrode lines with said separating portions to each other.

* * * * *